(12) United States Patent
Kim

(10) Patent No.: US 12,205,968 B2
(45) Date of Patent: Jan. 21, 2025

(54) IMAGE SENSING DEVICE

(71) Applicant: SK hynix Inc., Icheon-si (KR)

(72) Inventor: Jong Eun Kim, Icheon-si (KR)

(73) Assignee: SK hynix Inc., Icheon-si (KR)

( * ) Notice: Subject to any disclaimer, the term of this patent is extended or adjusted under 35 U.S.C. 154(b) by 386 days.

(21) Appl. No.: 17/857,917

(22) Filed: Jul. 5, 2022

(65) Prior Publication Data

US 2023/0098790 A1   Mar. 30, 2023

(30) Foreign Application Priority Data

Sep. 27, 2021 (KR) .......................... 10-2021-0127205

(51) Int. Cl.
*H01L 27/14* (2006.01)
*H01L 27/146* (2006.01)

(52) U.S. Cl.
CPC .... *H01L 27/14614* (2013.01); *H01L 27/1463* (2013.01)

(58) Field of Classification Search
CPC ......... H01L 27/14614; H01L 27/14616; H01L 27/1463; H01L 27/14638
See application file for complete search history.

(56) References Cited

U.S. PATENT DOCUMENTS 9,202,902 B2   12/2015   Kawahito
10,567,683 B2 *  2/2020   Guidash ............ H01L 27/14636

FOREIGN PATENT DOCUMENTS

KR   20130007121 A   1/2013
KR    101727270 B1   4/2017

* cited by examiner

*Primary Examiner* — Kevin K Pyo
(74) *Attorney, Agent, or Firm* — Perkins Coie LLP

(57) ABSTRACT

An image sensing device includes a photoelectric conversion region configured to generate photocharges, a photogate region configured to overlap the photoelectric conversion region and allow the photocharges to be collected in the photoelectric conversion region, and a transfer gate disposed adjacent to the photogate region in a first direction and configured to transmit the photocharges to a floating diffusion region. The photogate region includes a first photogate in which a length extending in a second direction is longer than a length of the photoelectric conversion region extending in the second direction, and a second photogate in which a length extending in the second direction is shorter than a length of the photoelectric conversion region extending in the second direction. The first photogate includes a recess region formed to contact the photoelectric conversion region, and extend vertically from one surface of a region where the photoelectric conversion region is located.

20 Claims, 15 Drawing Sheets

IMAGE SENSING DEVICE

CROSS-REFERENCE TO RELATED APPLICATION

This patent document claims the priority and benefits of Korean patent application No. 10-2021-0127205, filed on Sep. 27, 2021, the disclosure of which is incorporated by reference in its entirety as part of the disclosure of this patent document.

TECHNICAL FIELD

The technology and implementations disclosed in this patent document generally relate to an image sensing device.

BACKGROUND

An image sensing device is a device for capturing optical images by converting light into electrical signals using a photosensitive semiconductive material which reacts to light. With the development of automotive, medical, computer and communication industries, the demand for high-performance image sensing devices is increasing in various fields such as smart phones, digital cameras, game machines, IoT (Internet of Things), robots, security cameras and medical micro cameras.

The image sensing device may be roughly divided into CCD (Charge Coupled Device) image sensing devices and CMOS (Complementary Metal Oxide Semiconductor) image sensing devices. The CCD image sensing devices offer a better image quality, but they tend to consume more power and are larger as compared to the CMOS image sensing devices. The CMOS image sensing devices are smaller in size and consume less power than the CCD image sensing devices. Furthermore, CMOS sensors are fabricated using the CMOS fabrication technology, and thus photosensitive elements and other signal processing circuitry can be integrated into a single chip, enabling the production of miniaturized image sensing devices at a lower cost. For these reasons, CMOS image sensing devices are being developed for many applications including mobile devices.

SUMMARY

Various embodiments of the disclosed technology relate to an image sensing device capable of improving transmission efficiency of photocharges generated by incident light.

In accordance with an embodiment of the disclosed technology, an image sensing device may include a substrate having two opposite surfaces, a photoelectric conversion region located in the substrate and configured to generate photocharges in corresponding to incident light, a photogate region configured to overlap the photoelectric conversion region, and configured to allow the photocharges generated in the photoelectric conversion region to be collected in the photoelectric conversion region, and a transfer gate disposed adjacent to the photogate region in a first direction, and configured to transmit the photocharges collected in the photoelectric conversion region to a floating diffusion region, wherein the photogate region includes a first photogate having a length that extends in a second direction and longer than a length of the photoelectric conversion region extending in the second direction, and a second photogate having a length that extends in the second direction and shorter than a length of the photoelectric conversion region extending in the second direction, wherein the first photogate includes a recess region contacting a side surface of the photoelectric conversion region, and extending vertically from one surface of the substrate with which the photoelectric conversion region is located in contact or near.

In some implementations, the first photogate is disposed between the second photogate and the transfer gate, and the first photogate and the second photogate are in contact with each other.

In some implementations, the image sensing device may further include a trench region formed to surround the photoelectric conversion region, wherein the recess region is disposed in the trench region.

In some implementations, the trench region has an etched portion and the recess region is disposed in the etched portion of the trench region.

In some implementations, the transfer gate is configured to receive a transmission control signal, and allow the photocharges to move from the photoelectric conversion region to the floating diffusion region based on the transmission control signal.

In some implementations, the transfer gate overlaps the photoelectric conversion region and the floating diffusion region.

In some implementations, the first photogate is connected to a first photogate contact and the second photogate is connected to a second photogate contact.

In some implementations, the first photogate contact is located closer to the photoelectric conversion region than the second photogate contact.

In some implementations, the first photogate contact is connected to a first signal line and the second photogate contact is connected to a second signal line, wherein a first photogate control signal applied to the first signal line and the second photogate control signal applied to the second signal line are activated at different time points.

In some implementations, when the first photogate control signal has an activation level, a first collection region is disposed in the photoelectric conversion region and when the second photogate control signal has an activation level, a second collection region is disposed in the photoelectric conversion region, wherein a length of the first collection region extending in the second direction is longer than a length of the second collection region extending in the second direction.

In some implementations, a length of the second collection region extending in the first direction is longer than a length of the first collection region extending in the first direction.

In some implementations, the first photogate contact and the second photogate contact are connected to one signal line.

In some implementations, the floating diffusion region is connected to a readout circuit, wherein the readout circuit includes at least one of a drive transistor, a reset transistor, and a selection transistor.

In some implementations, a length of the floating diffusion region extending in the second direction is shorter than a length of the transfer gate extending in the second direction.

In accordance with an embodiment of the disclosed technology, an image sensing device may include a substrate, a photoelectric conversion region located in the substrate and having a thickness from a surface of the substrate and configured to generate photocharges in response to light incident on the substrate, a first photogate region disposed over the photoelectric conversion region and configured to receive a first control signal to collect the photocharges in a first portion of the photoelectric conversion region, a second photogate region disposed over the photoelectric conversion region and configured to receive a second control signal to collect the photocharges in a second portion of the photoelectric conversion region and a trench region disposed on sides of the photoelectric conversion region and having a thickness greater than the thickness of the photoelectric conversion region, and wherein a portion of the first photogate region is disposed in the trench region.

In some implementations, the first photogate region has a length extending in a direction that is longer than a length of the photoelectric conversion region extending in the direction.

In some implementations, the second photogate region has a length extending in a direction that is shorter than a length of the photoelectric conversion region extending in the direction.

In some implementations, the image sensing device may further include a floating diffusion region disposed to contact the surface of the substrate and a transfer gate disposed over the substrate to transmit the photocharges collected in the photoelectric conversion region to the floating diffusion region.

In some implementations, the image sensing device may further include a first photogate contact disposed on the first photogate region and configured to supply the first control signal to the first photogate region; and a second photogate contact disposed on the second photogate region and configured to supply the second control signal to the second photogate region.

In some implementations, the first photogate contact is located closer to the photoelectric conversion region than the second photogate contact.

It is to be understood that both the foregoing general description and the following detailed description of the disclosed technology are illustrative and explanatory and are intended to provide further explanation of the disclosure as claimed.

BRIEF DESCRIPTION OF THE DRAWINGS

The above and other features and beneficial aspects of the disclosed technology will become readily apparent with reference to the following detailed description when considered in conjunction with the accompanying drawings.

DETAILED DESCRIPTION

This patent document provides implementations and examples of image sensing device designs that may be used in configurations to substantially address one or more technical or engineering issues and to mitigate limitations or disadvantages encountered in some other image sensing device designs. Some implementations of the disclosed technology provide an image sensing device which can improve transmission efficiency of photocharges generated by incident light. Some implementations of the disclosed technology can adjust transmission efficiency of photocharges according to the shape of a photogate included in a unit pixel.

Reference will now be made in detail to certain embodiments, examples of which are illustrated in the accompanying drawings. Wherever possible, the same reference numbers will be used throughout the drawings to refer to the same or similar parts. In the following description, a detailed description of related known configurations or functions incorporated herein will be omitted to avoid obscuring the subject matter. However, it should be understood that the disclosed technology is not limited to specific embodiments, but includes various modifications, equivalents and/or alternatives of the embodiments.

Figure 1:
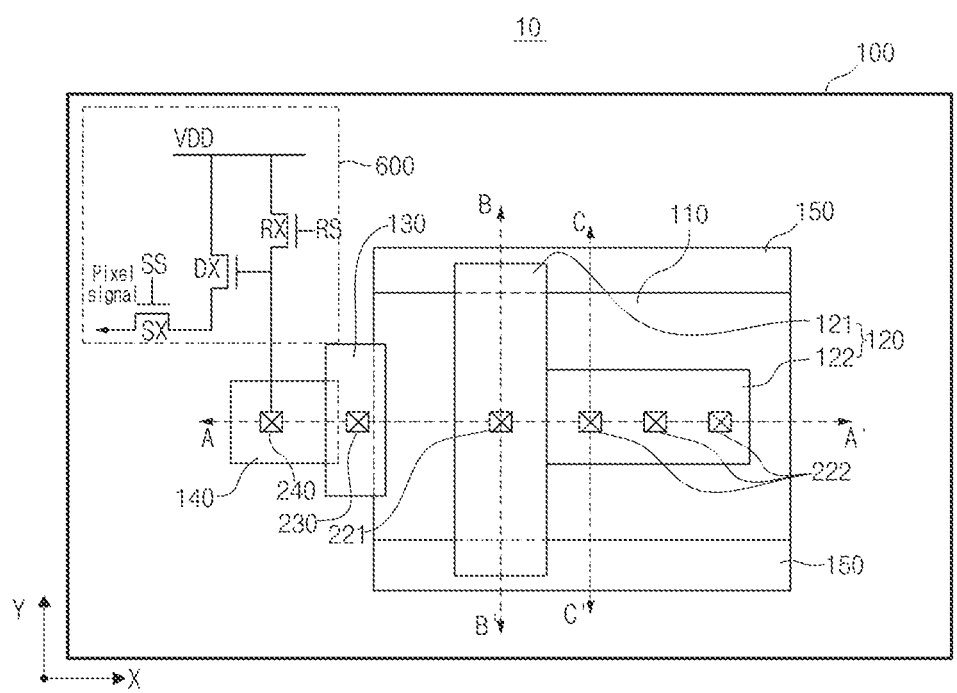
FIG. 1 is a schematic diagram illustrating an example of a partial structure of a unit pixel for use in an image sensing device according to an exemplary embodiment of the disclosed technology.

FIG. 1 is a schematic diagram illustrating an example of a partial structure 10 of a unit pixel for use in an image sensing device according to an exemplary embodiment of the disclosed technology.

The images sensing device may include a controller for controlling constituent elements (e.g., a pixel array, and pixel transistors included in the pixel array) included in the image sensing device, a sensing unit for sensing incident light and outputting a pixel signal, and a processor for generating a digital signal by processing the pixel signal.

In some implementations, the sensing unit may include a pixel array in which a plurality of unit pixels is arranged in a matrix. The controller may include a row driver, a timing controller, etc., each of which can apply a control signal to the pixel array. The processor may include, for example, a correlated double sampler (CDS), an analog-to-digital converter (ADC), etc.

Referring to FIG. 1, the unit pixel may be formed in a substrate 100. In some implementations, the unit pixel may be included in a pixel array, and may be a minimum unit repeated in the pixel array. Thus, the pixel array can include multiple unit pixels in rows and columns.

The unit pixel may include a photoelectric conversion region 110, a photogate region 120, a transfer gate 130, a floating diffusion region 140, a trench region 150, and a readout circuit 600.

In addition, the unit pixel may include photogate contacts 221 and 222 connected to the photogate region 120, a transfer gate contact 230 connected to the transfer gate 130, and a floating diffusion contact 240 connected to the floating diffusion region 140.

The photoelectric conversion region 110 may be formed in the substrate 100 to be in contact with or near a top surface of the substrate 100. The substrate 100 may include, for example, a silicon substrate doped with impurities, an epitaxial layer, or a stacked structure of the silicon substrate and the epitaxial layer.

The photoelectric conversion region 110 may generate photocharge in corresponding to incident light. The photoelectric conversion region 110 may include a photodiode, a phototransistor, a pinned photodiode, and/or a combination thereof. The photoelectric conversion region 110 can have a suitable photosensing structure that can generate photocharge in response to receiving the incident light.

The photogate region 120 may be formed over the substrate 100 to vertically overlap the photoelectric conversion region 110. The photogate region 120 may include a first photogate 121 and a second photogate 122 that are adjacent to each other in a first direction (X-direction). An insulation layer may be formed between the photogate region 120 and the substrate 100. The insulation layer may include, for example, a silicon oxide layer, etc.

The first photogate 121 may be formed in a rectangular shape in which a length extending in a second direction (Y-direction) is longer than a length extending in the first direction (X-direction). In addition, the second photogate 122 may be formed in a rectangular shape in which a length extending in the first direction (X-direction) is longer than a length extending in the second direction (Y-direction). The photogate region 120 including the first photogate 121 and the second photogate 122 may be formed in a T-shape. The first photogate 121 and the second photogate 122 may be formed to be in contact with each other.

The photogate region 120 may include polysilicon or transparent conducting oxide (TCO). For example, the photogate region 120 may include a transparent conducting oxide (TCO), for example, indium tin oxide (ITO), indium zinc oxide (IZO), zinc oxide (ZnO), titanium dioxide (TiO2), or a combination thereof.

The transfer gate 130 may be formed to overlap the photoelectric conversion region 110 and the floating diffusion region 140. The transfer gate 130 may be disposed adjacent to the photogate region 120 in a first direction at an upper portion of the substrate 100.

An insulation layer may be formed between the transfer gate 130 and the substrate 100. The insulation layer may include, for example, silicon oxide.

The transfer gate 130 may be controlled by a transmission control signal applied to the transfer gate 130, and may transmit charges generated by the photoelectric conversion region 110 to the floating diffusion region 140. The transfer gate 130 may include a conductor. For example, the conductor may include metal or polysilicon.

For example, the transmission control signal may be transferred from the controller included in the image sensing device to the transfer gate 130.

The floating diffusion region 140 may be formed in the substrate 100 to be in contact with or near a top surface of the substrate 100. The floating diffusion region 140 may accumulate photocharges from the photoelectric conversion region 110 that have been transmitted by the transfer gate 130.

The substrate 100 has two surfaces, a top surface and a bottom surface, which are at opposite sides of the substrate 100. In implementations, the device may be used in a backside illuminated mode to receive incident light from the bottom surface of the substrate 100 so that the incident light passes through the substrate 100 towards the top surface to enter the photoelectric conversion region 110 in which the photocharge is generated and is transferred via the transfer gate 130 to the floating diffusion region 140 near the top surface of the substrate 100. The floating diffusion region 140 may include N-type impurities (N+ impurities). The floating diffusion region 140 may have a higher doping density than the semiconductor substrate 100.

The floating diffusion region 140 may be coupled to the readout circuit 600 through the floating diffusion contact 240.

The trench 150 may be formed to surround the photoelectric conversion region 110, and may be formed to be in contact with the top surface of the substrate 100.

In some implementations, the trench 150 may include an insulation material. The trench 150 may allow the photoelectric conversion region 110 in a particular unit pixel to be electrically isolated from the photoelectric conversion region 110 included in another unit pixel adjacent to the particular unit pixel.

The readout circuit 600 may output a pixel signal corresponding to charges accumulated in the floating diffusion region 140.

The readout circuit 600 may include a reset transistor RX, a drive transistor DX, and a selection transistor SX. A power-supply voltage node (VDD) may be coupled to one side of the reset transistor RX, and a floating diffusion region 140 may be coupled to the other side of the reset transistor RX. The floating diffusion region 140 may be initialized by the reset signal RS applied to the reset transistor RX.

A gate of the drive transistor DX may be connected to the floating diffusion region 140. Further, one side of the drive transistor DX may be coupled to the power-supply voltage node (VDD) and the other side of the drive transistor DX may be coupled to the selection transistor SX.

The drive transistor DX may generate and output a pixel signal corresponding to a voltage generated by charges accumulated in the floating diffusion region 140. The selection transistor SX may be an output node in which one side is coupled to the drive transistor DX and the other side outputs the pixel signal.

The selection transistor SX may output a signal that is output from the drive transistor DX as a pixel signal in response to the selection signal SS applied to the gate thereof.

The photogate contacts 221 and 222 may be in contact with the photogate region 120, and may electrically connect the photogate region 120 to a signal line, so that a photogate control signal can be applied to the photogate region 120. In some implementations, the photogate control signal may be applied to the photogate region 120 through a controller included in the image sensing device.

In some implementations, the photogate contacts 221 and 222 may include a first photogate contact 221 connected to the first photogate 121 and a second photogate contact 222 connected to the second photogate 122. Each of the first photogate contact 221 and the second photogate contact 222 may transmit a photogate control signal to a corresponding photogate.

For example, the first photogate contact 221 may transmit a first photogate control signal to the first photogate 121, and the second photogate contact 222 may transmit a second photogate control signal to the second photogate 122.

In another embodiment, the first photogate contact 221 and the second photogate contact 222 may be connected to one signal line, and the same photogate control signal may be applied to the first photogate 121 and the second photogate 122 through the first photogate contact 221 and the second photogate contact 222.

Each of the photogate contacts 221 and 222 may include a conductive material. For example, the conductive material may include polysilicon or metal.

The transfer gate contact 230 may be connected to the transfer gate 130, and may transmit a transmission control signal to the transfer gate 130. The floating diffusion contact 240 may be connected to the floating diffusion region, and may transmit a signal corresponding to the charges accumulated in the floating diffusion region 140 to the readout circuit 600. The transfer gate contact 230 and the floating diffusion contact 240 may be formed of or include the same material as the photogate contacts 221 and 222.

In some implementations, the transmission control signal may be applied to the transfer gate contact 230 by a controller included in the image sensing device.

Figure 2:
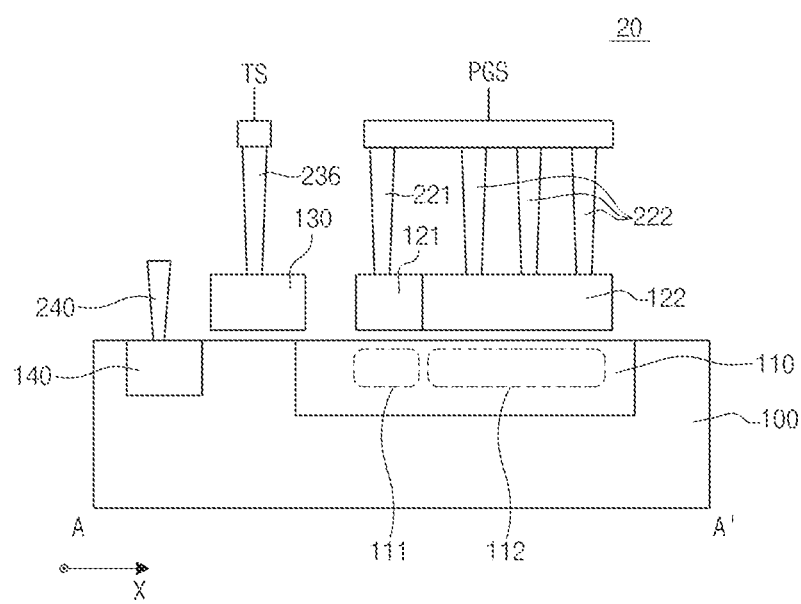
FIG. 2 is a cross-sectional view illustrating one example of the unit pixel taken along a first cutting line according to an exemplary embodiment of the disclosed technology.

FIG. 2 is a cross-sectional view 20 illustrating one example of the unit pixel taken along a first cutting line A-A' according to an exemplary embodiment of the disclosed technology.

FIG. 2 illustrates a vertical structure of the substrate 100, the photoelectric conversion region 110, the first photogate 121, the second photogate 122, the transfer gate 130, the floating diffusion region 140, the photogate contacts 221 and 222, the transfer gate contact 230, and the floating diffusion contact 240.

As shown in the example in FIG. 2, the photoelectric conversion region 110 may be located in the substrate 100 to be in contact with or near the top surface and is structured to include a first charge collection region 111 and a second charge collection region 112.

In some implementations, in response to a control signal PGS applied to the photogate region 120, the photogate region 120 may move charges generated by the photoelectric conversion region 110 within the photoelectric conversion region 110. For example, the photogate region 120 may move photocharges generated by the photoelectric conversion region 110 to be collected in the first charge collection region 111 and the second charge collection region 112.

For example, the photogate control signal PGS may be a signal having an activation voltage or a deactivation voltage. When the photogate control signal PGS having an activation voltage is applied to the photogate region 120, photocharges generated in the photoelectric conversion region 110 may move to a specific region within the photoelectric conversion region 110 by an electric field generated by the photogate control signal PGS.

The photogate control signal PGS may be applied to the photogate region 120 through the photogate contacts 221 and 222.

When the transmission control signal TS having an activation voltage is applied to the transfer gate 130, the photocharges having moved to the first charge collection region 111 may move from the first charge collection region 111 to the floating diffusion region 140.

The transmission control signal TS may be transmitted from the signal line to the transfer gate 130 through the transfer gate contact 230.

Figure 3:
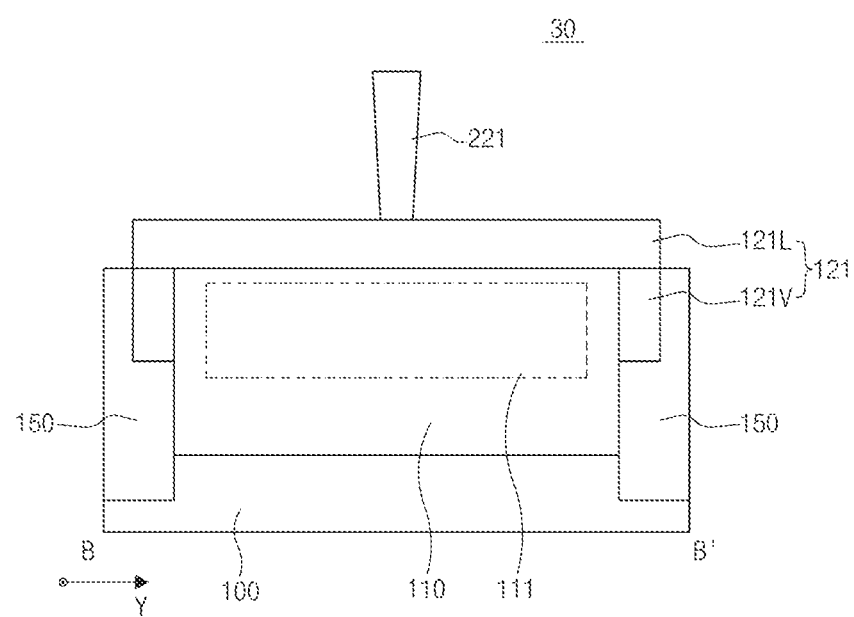
FIG. 3 is a cross-sectional view illustrating one example of the unit pixel taken along a second cutting line according to an exemplary embodiment of the disclosed technology.

FIG. 3 is a cross-sectional view 30 illustrating one example of the unit pixel taken along a second cutting line B-B' according to an exemplary embodiment of the disclosed technology.

Referring to FIG. 3, a substrate 100, a photoelectric conversion region 110 formed over the substrate 100, a trench 150, a first photogate 121 formed to overlap the photoelectric conversion region 110, and a first photogate contact 221 connected to the first photogate 121 are illustrated.

The first photogate 121 may include a horizontal region 121L and a recess region 121V. The horizontal region 121L may be in contact with one surface of the substrate 100, and the length of the horizontal region 121L extending in the second direction (Y-direction) may be longer than the length of the photoelectric conversion region 110 extending in the second direction.

When the photogate control signal is applied to the first photogate 121, an electric field may be formed in the photoelectric conversion region 110 located below the horizontal region 121L. At this time, photocharges can be collected in the first charge collection region 111 by the electric field. The shape of the first charge collection region 111 may be determined according to the shape of the first photogate 121 and the photogate control signal applied to the first photogate 121.

A trench region 150 may allow the photoelectric conversion region 110 to be electrically/physically separated from another photoelectric conversion region 110 included in another unit pixel adjacent to the photoelectric conversion region 110.

The trench region 150 may be formed to be deeper than the photoelectric conversion region 110 with respect to one surface of the substrate 100. At this time, one surface of the substrate 100 may be a surface facing or opposite to a light receiving surface.

As the trench region 150 is formed to be deeper than the photoelectric conversion region 110 with respect to one surface of the substrate 100, movement of photocharges between adjacent unit pixels can be restricted. As such movement of photocharges between adjacent unit pixels is restricted, noise of the pixel signal can be reduced.

The recess region 121V may be formed in the trench 150. The recess region 121V may extend from one surface of the substrate 100 in a direction perpendicular to the other surface of the substrate 100 (e.g., in a direction perpendicular to the X-direction or the Y-direction).

The recess region 121V may be in contact with the horizontal region 121L. In addition, the recess region 121V may be formed to extend from the horizontal region 121L toward the inside of the trench 150.

The recess region 121V may be in contact with a side surface of the photoelectric conversion region 110. When a photogate control signal is applied to the first photogate 121, the electric field may be formed on a side surface of the photoelectric conversion region 110 through the recess region 121V.

Charges generated in the photoelectric conversion region 110 may be easily collected in a region adjacent to the recess region 121V by the electric field. When the recess region 121V is formed, charges are easily collected in the first charge collection region 111 and the amount of collected charges can increase.

The recess region 121V and the horizontal region 121L may be physically and electrically interconnected. In some implementations, the recess region 121V and the horizontal region 121L may include the same conductive material (e.g., metal or polysilicon).

The first photogate 121 may be formed by interconnecting the recess region 121V and the horizontal region 121L. The first photogate 121 may be separated from the photoelectric conversion region 110 through the insulation layer.

Figure 4:
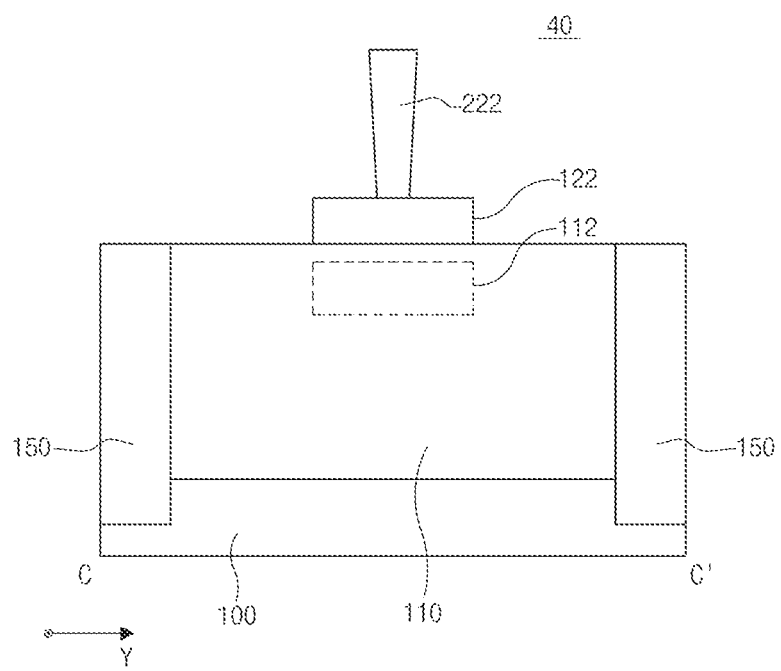
FIG. 4 is a cross-sectional view illustrating one example of the unit pixel taken along a third cutting line according to an exemplary embodiment of the disclosed technology.

FIG. 4 is a cross-sectional view 40 illustrating one example of the unit pixel taken along a third cutting line C-C' according to an exemplary embodiment of the disclosed technology.

Referring to FIG. 4, a substrate, a photoelectric conversion region 110 formed over the substrate 100, a trench 150, a second photogate 122 formed to overlap the photoelectric conversion region 110, and a second photogate contact 222 connected to the second photogate 122 are illustrated.

The second photogate 122 may be in contact with one surface of the substrate 100, and the length of the second photogate 122 extending in the second direction (Y-direction) may be shorter than the length of the photoelectric conversion region 110 extending in the second direction.

When the photogate control signal is applied to the second photogate 122, an electric field may be formed in the photoelectric conversion region 110 located below the second photogate 122. At this time, photocharges can be collected in the second charge collection region 112 by the electric field.

In some implementations, the length of the second charge collection region 112 extending in the second direction (Y-direction) may be equal to the length of the second photogate 122 extending in the second direction. The shape of the second charge collection region 112 may be determined according to the shape of the second photogate 122 and the photogate control signal applied to the second photogate 122.

Figure 5:
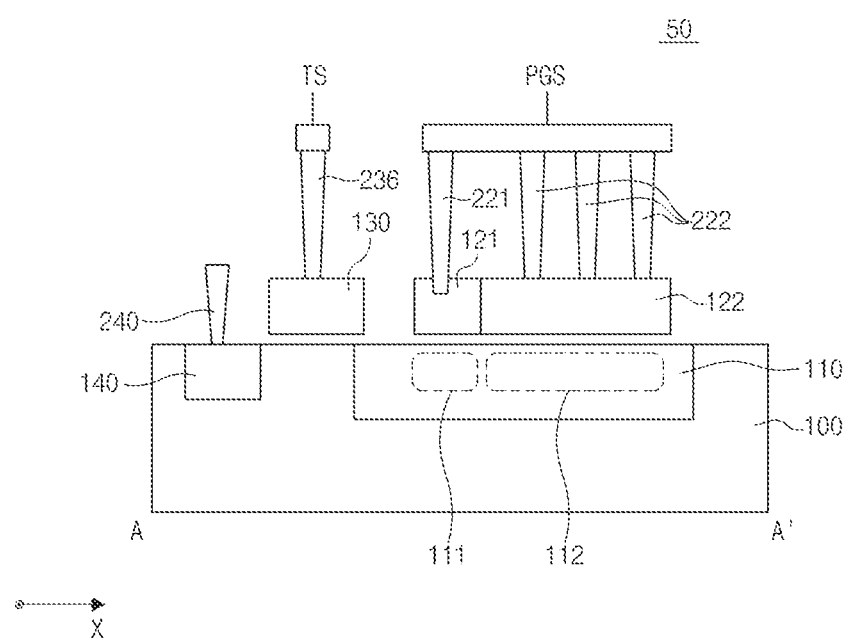
FIG. 5 is a cross-sectional view illustrating one example of the unit pixel taken along a first cutting line according to another embodiment of the disclosed technology.

FIG. 5 is a cross-sectional view 50 illustrating one example of the unit pixel taken along the first cutting line A-A' according to another embodiment of the disclosed technology.

The implementation as shown in FIG. 5 has some structures substantially the same as those in FIG. 2. Thus, such redundant description thereof will herein be omitted for convenience of description. The descriptions here will be focused on the structures and characteristics different from those of FIG. 2.

The cross-section 50 of the unit pixel according to another embodiment of the disclosed technology may be different in shape of the first photogate contact 221 from the cross-section 20 of the unit pixel according to one embodiment of the disclosed technology.

The first photogate contact 221 may be formed to extend into the first photogate 121. As the first photogate contact 221 extends into the first photogate 121, the first photogate contact 221 may be located closer to the photoelectric conversion region than the second photogate contact 222.

A region where the first photogate contact 221 is connected to the first photogate 121 may be more over-etched than a region where the second photogate contact 222 is connected to the second photogate 122. Thus, the first photogate contact 221 may be located closer to the photoelectric conversion region 110 than the second photogate contact 222.

When the first photogate contact 221 is located closer to the photoelectric conversion region 110 than the second photogate contact 222, the electric field generated by the first photogate contact 221 may have a greater influence on the photoelectric conversion region 110 than the electric field generated by the second photogate contact 222.

For example, the intensity of the electric field applied to the first charge collection region 111 located below the first photogate 121 may be greater than the intensity of the electric field applied to the second charge collection region 112 located below the second photogate 122.

Charge collection and charge transfer in the first charge collection region 111 may be faster than charge collection and charge transfer in the second charge collection region 112 due to a difference in intensity between the electric field applied to the first charge collection region 111 and the electric field applied to the second charge collection region 112. In addition, the amount of photocharges collected in the first charge collection region 111 may be greater than the amount of photocharges collected in the second charge collection region 112.

Figure 6:
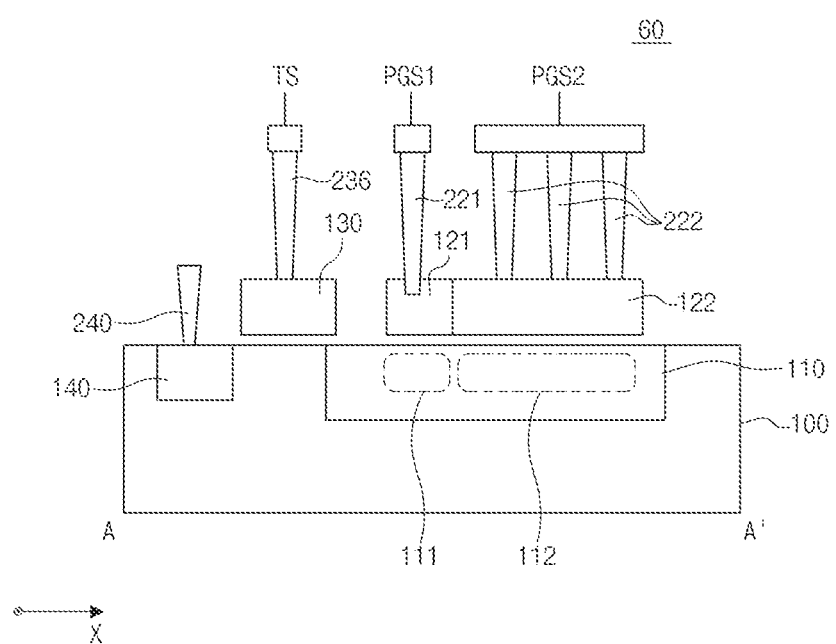
FIG. 6 is a cross-sectional view illustrating one example of the unit pixel taken along a first cutting line according to still another embodiment of the disclosed technology.

FIG. 6 is a cross-sectional view 60 illustrating one example of the unit pixel taken along the first cutting line A-A' according to still another embodiment of the disclosed technology.

The implementation as shown in FIG. 6 has some structures substantially the same as those in FIG. 2. Thus, such redundant description thereof will herein be omitted for convenience of description. The descriptions here will be focused on the structures and characteristics different from those of FIG. 2.

The cross-section 60 of the unit pixel according to still another embodiment of the disclosed technology may be different in shape of a signal line connected to the first photogate contact 221 and the second photogate contact 222 from the cross-section 20 of the unit pixel according to one embodiment of the disclosed technology.

The signal line connected to the first photogate contact 221 and the signal line connected to the second photogate contact 222 may be separated from each other. Therefore, different photogate control signals can be applied to the first photogate contact 221 and the second photogate contact 222.

In some implementations, the signal line connected to the first photogate contact 221 may be referred to as a first signal line, and the signal line connected to the second photogate contact 222 may be referred to as a second signal line.

In addition, the photogate control signal applied to the first photogate contact 221 may be referred to as a first photogate control signal PGS1, and the photogate control signal applied to the second photogate contact 222 may be referred to as a second photogate control signal PGS2.

The first photogate control signal PGS1 and the second photogate control signal PGS2 may have different operation time points. In some implementations, the second photogate control signal PGS2 has an activation voltage at a time point faster than the first photogate control signal PGS1. At a time point where the second photogate control signal PGS2 transitions to the deactivation voltage, the first photogate control signal PGS1 may sequentially cause the first photogate control signal PGS1 to have an activation voltage. Here, the activation voltage may refer to a voltage that collects and transfers charges in the charge collection regions 111 and 112 adjacent to the photogates 121 and 122.

As the first photogate control signal PGS1 and the second photogate control signal PGS2 sequentially have an activation voltage, photocharges generated in the photoelectric conversion region 110 may sequentially move from the second charge collection region 112 to the first charge collection region 111.

In addition, as the photogate control signals applied to the first photogate 121 and the second photogate 122 are separated from each other, the first photogate control signal PGS1 and the second photogate control signal PGS2 may have different activation voltages. For example, a photogate control signal having a larger activation voltage may be applied to a region where rapid charge collection and rapid charge transfer are required.

Figure 7:
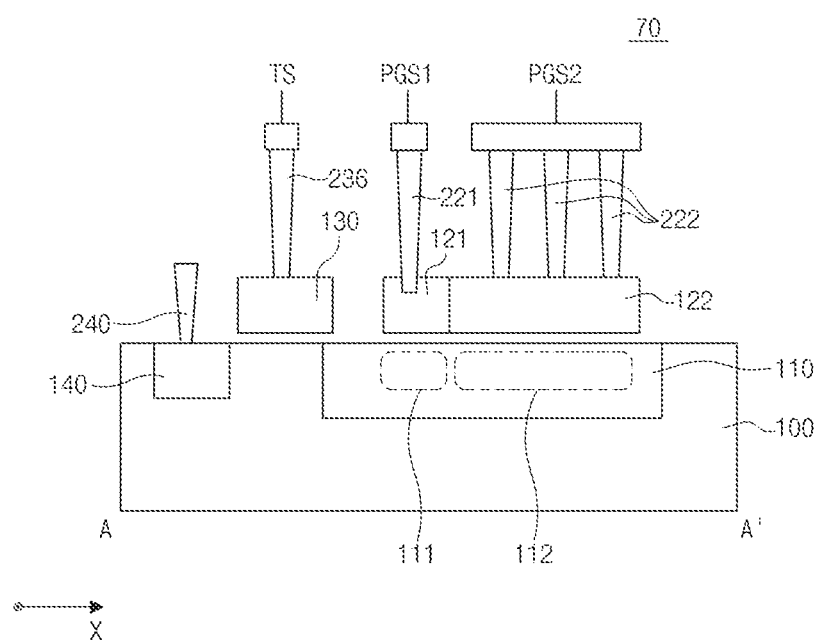
FIG. 7 is a cross-sectional view illustrating one example of the unit pixel taken along a first cutting line according to still another embodiment of the disclosed technology.

FIG. 7 is a cross-sectional view 70 illustrating one example of the unit pixel taken along the first cutting line A-A' according to still another embodiment of the disclosed technology.

The cross-section 70 of the unit pixel according to another embodiment of the disclosed technology may have a shape in which the first photogate contact 221 extends into the first photogate 121 as compared to the cross-section 20 of the unit pixel according to one embodiment of the disclosed technology. As the first photogate contact 221 extends into the first photogate 121, the first photogate contact 221 may be located closer to the photoelectric conversion region than the second photogate contact 222.

In addition, the signal line through which the first photogate control signal PGS1 is applied to the first photogate contact 221 and the signal line through which the second photogate control signal PGS2 is applied to the second photogate contact 222 can be separated from each other.

The first photogate contact 221 is formed closer to the photoelectric conversion region than the second photogate contact 222, and the first photogate control signal PGS1 and the second photogate control signal PGS2 are separated from each other, so that the intensity of the electric field applied to the photoelectric conversion region 110 can be more precisely controlled.

Figure 8:
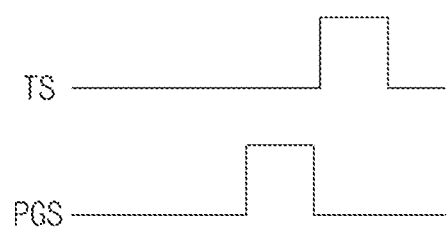
FIG. 8 is a timing diagram illustrating operation time points of a transmission control signal and a photogate control signal according to an exemplary embodiment of the disclosed technology.

FIG. 8 is a timing diagram illustrating operation time points of the transmission control signal and the photogate control signal according to an exemplary embodiment of the disclosed technology.

As can be seen from FIG. 8, when the first photogate contact and the second photogate contact are connected to a common signal line, the operation time points of the photogate control signal PGS and the transmission control signal TS are illustrated.

The photogate control signal PGS may have an activation voltage earlier than the transmission control signal TS, and the transmission control signal TS may have an activation voltage at a time point where the photogate control signal PGS transitions from an activation voltage to a deactivation voltage.

Photocharges generated in the photoelectric conversion region at a time point where the photogate control signal PGS has an activation voltage may be collected at a lower end of the photogate. At a time point where the photogate control signal PGS transitions to a deactivation voltage and the transmission control signal TS has an activation voltage, photocharges can be transferred from the photoelectric conversion region to the floating diffusion region.

Since the first photogate has a recess region and the first photogate has a longer length extending in the second direction than the photoelectric conversion region extending in the second direction, the amount of charges collected in the first charge collection region located below the first photogate can increase.

Figure 9:
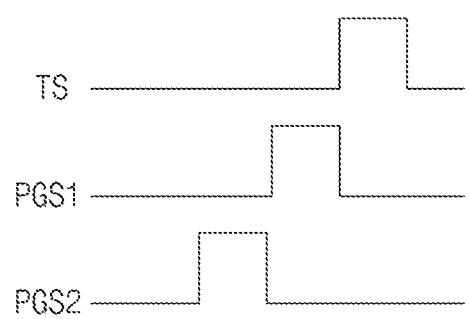
FIG. 9 is a timing diagram illustrating operation time points of a transmission control signal, a first photogate control signal, and a second photogate control signal according to still another embodiment of the disclosed technology.

FIG. 9 is a timing diagram illustrating operation time points of the transmission control signal, the first photogate control signal, and the second photogate control signal according to still another embodiment of the disclosed technology.

Referring to FIG. 9, when the first photogate contact and the second photogate contact are connected to different signal lines, the operation time points of the first photogate control signal PGS1 applied to the first photogate contact, the second photogate control signal PGS2 applied to the second photogate contact, and the transmission control signal TS applied to the transfer gate contact are illustrated.

The second photogate control signal PGS2 may have an activation voltage earlier than the first photogate control signal PGS1. The first photogate control signal PGS1 may have an activation voltage at a time point where the second photogate control signal PGS2 transitions from an activation voltage to a deactivation voltage.

In addition, the transmission control signal TS may have an activation voltage at a time point where the first photogate control signal PGS1 transitions from an activation voltage to a deactivation voltage.

Photocharges generated in the photoelectric conversion region at a time point where each of the photogate control signals PGS1 and PGS2 has an activation voltage may be collected at a lower end of the first photogate or the second photogate.

For example, photocharges are collected in the second charge collection region located at the lower end of the second photogate at a time point where the second photogate control signal PGS2 has an activation voltage. Photocharges are collected in the first charge collection region at a time point where the second photogate control signal GPS2 transitions to a deactivation voltage and the first photogate control signal PGS1 has an activation voltage.

In the embodiment of FIG. 9, the first photogate control signal PGS1 and the second photogate control signal PGS2 are activated at different time points, and thus the region where photocharges are densely concentrated may be determined differently according to the activated signals.

For example, at a time point where the second photogate control signal PGS2 transitions to a deactivation voltage and the first photogate control signal PGS1 has an activation voltage, the amount of photocharges concentrated in the first charge collection region may be greater than the amount of photocharges concentrated in the second charge collection region.

When the amount of photocharges concentrated in the first charge collection region is large, the amount of photocharges scheduled to move from the photoelectric conversion region to the floating diffusion region may increase at a time point where the photogate control signal PGS transitions to a deactivation voltage and the transmission control signal TS has an activation voltage.

Thus, when the photogate control signals respectively applied to the first photogate and the second photogate are distinguished from each other, photocharges can be easily collected and moved.

FIGS. 10A to 10E are diagrams illustrating methods for forming a unit pixel according to an exemplary embodiment of the disclosed technology.

Figure 10A:
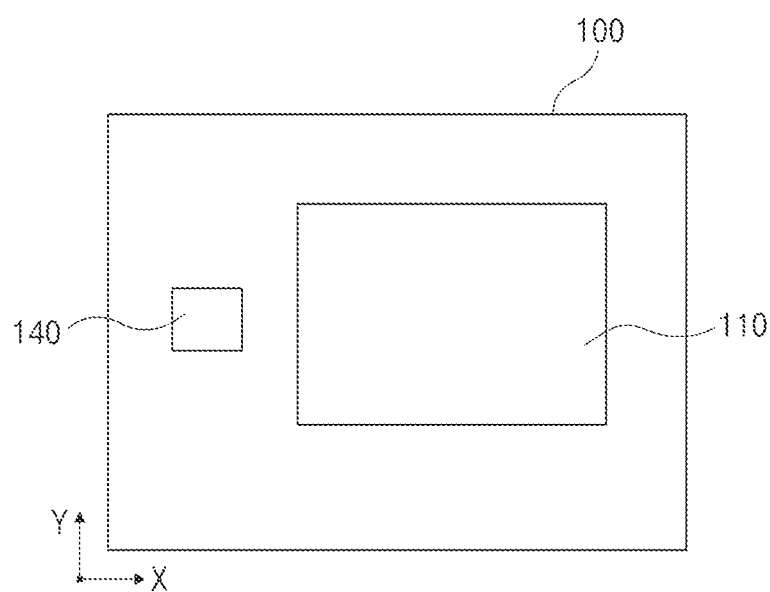
FIGS. 10A to 10E are diagrams illustrating methods for forming a unit pixel according to an exemplary embodiment of the disclosed technology.

FIG. 10A illustrates a process for forming the photoelectric conversion region 110 and the floating diffusion region 140 in the substrate 100. The photoelectric conversion region 110 and the floating diffusion region 140 may be formed through ion implantation on the substrate 100. The photoelectric conversion region 110 and the floating diffusion region 140 may include an impurity doped region.

Figure 10B:
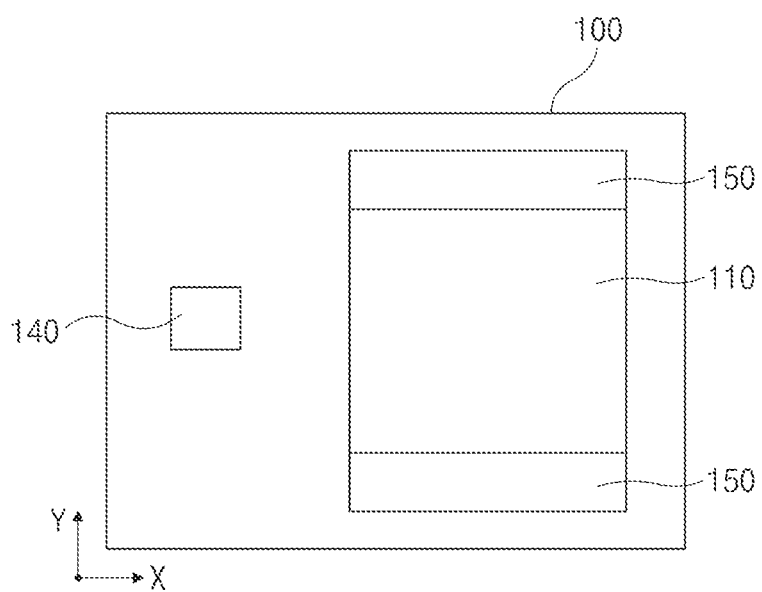

FIG. 10B illustrates a process for forming the trench region 150 contacting the photoelectric conversion region 110. The trench region 150 may be formed at a position where the adjacent photoelectric conversion regions 110 can be electrically/physically separated from each other.

According to an embodiment, the trench region 150 may be formed by etching the substrate 100 and doping an insulation material in the etched region. According to another embodiment, the trench region 150 may be formed by stacking a plurality of doped regions.

Figure 10C:
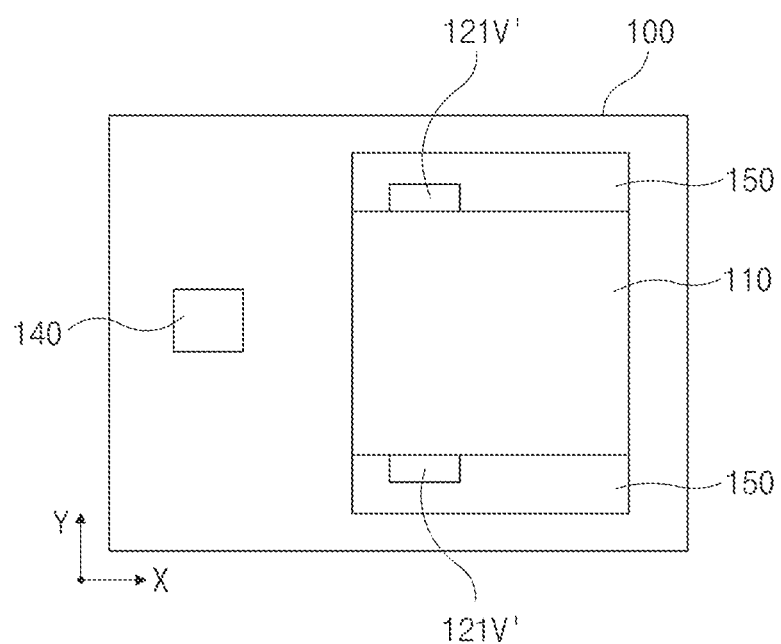

FIG. 10C illustrates a process of forming an etched region 121V' in the trench region 150.

The etched region 121V' may be formed through an etching process, and the depth of the etched region 121V' may be smaller than the depth of the trench region 150.

Figure 10D:
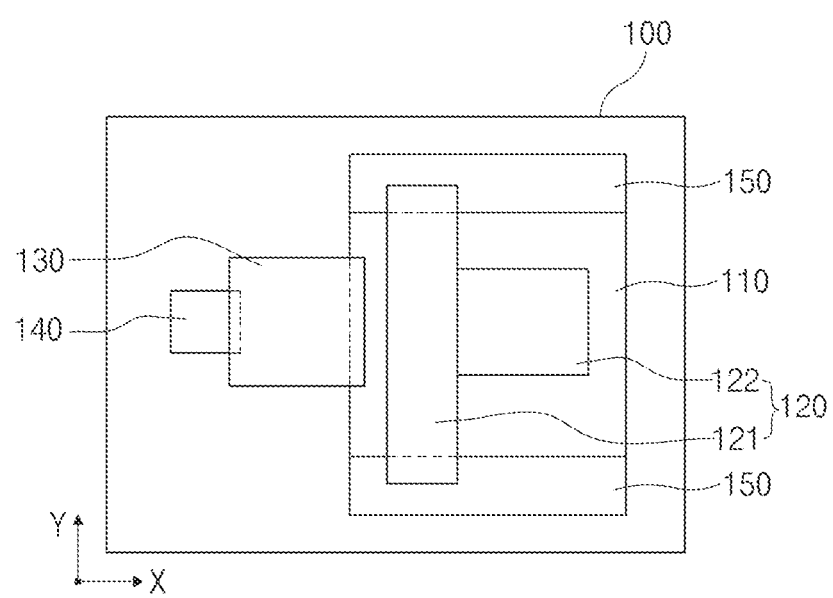

FIG. 10D illustrates a process for forming the transfer gate 130 and the photogate region 120.

The transfer gate 130 and the photogate region 120 may be formed over one surface of the substrate 100, and an insulation layer may be formed between the transfer gate 130 and the substrate 100. Similarly, an insulation layer may be formed between the photogate region 120 and the substrate 100.

Due to the insulation layer, the transfer gate 130 and the floating diffusion region 140 may be separated from each other, and the transfer gate 130 and the photoelectric conversion region 110 may be separated from each other. Similarly, the photogate region 120 and the photoelectric conversion region 110 may be separated from each other by the insulation layer.

The transfer gate 130 may be formed to overlap the floating diffusion region 140 and the photoelectric conversion region 110. The photogate region 120 may be formed to overlap the photoelectric conversion region 110.

The first photogate 121 included in the photogate region 120 may include a recess region formed in the etched region 121V' of FIG. 10C. As the first photogate 121 includes a recess region, charges can be easily collected in a lower portion of the first photogate 121.

In addition, the first photogate 121 extending in the second direction (Y-direction) may be longer in length than the photoelectric conversion region 110 extending in the second direction. The second photogate 122 extending in the second direction (Y-direction) may be shorter in length than the photoelectric conversion region 110 extending in the second direction.

The first photogate 121 may be formed in a rectangular shape in which the length extending in the second direction (Y-direction) is longer than the length extending in the first direction (X-direction). The second photogate 122 may be formed in a rectangular shape in which the length extending in the first direction is longer than the length extending in the second direction.

Accordingly, the photogate including the first photogate 121 and the second photogate 122 may be formed in a T-shape.

The photogate region 120 may be formed through a deposition process, and may include metal, polysilicon, transparent conductive oxide, or a combination thereof.

Figure 10E:
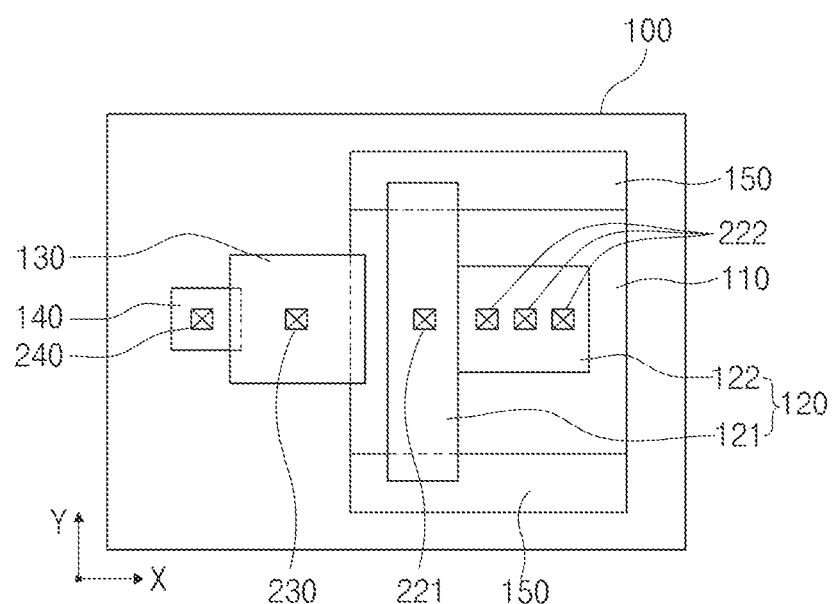

FIG. 10E illustrates a process for forming the floating diffusion region contact 240, the transfer gate contact 230, and the photogate contacts 221 and 222.

Referring to FIG. 10E, a region where the contacts 221, 222, 230, and 240 are to be formed may be formed through the etching process, and this region may be deposited with the conductive material, resulting in formation of the contacts 221, 222, 230, and 240. For example, the contacts may include metal, polysilicon, or a combination thereof.

Figure 11:
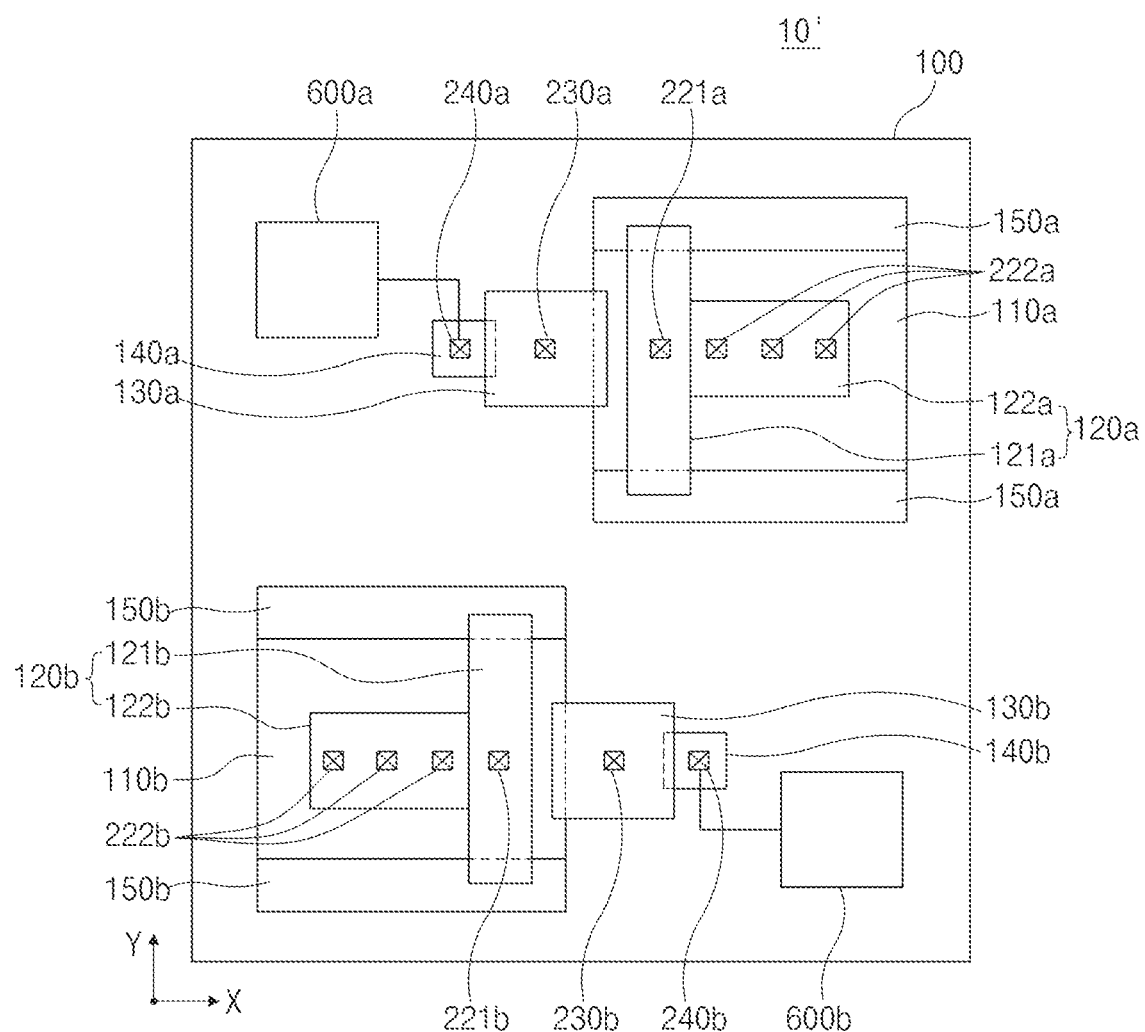
FIG. 11 is a schematic diagram of an example of a partial structure of an image sensing device according to still another embodiment of the disclosed technology.

FIG. 11 is a schematic diagram of an example of a partial structure 10' of an image sensing device according to still another embodiment of the disclosed technology.

Referring to FIG. 11, one unit pixel may include a photoelectric conversion region A (110a), a photoelectric conversion region B (110b), a photogate A (120a), a photogate B (120b), a transfer gate A (130a), a transfer gate B (130b), a floating diffusion region A (140a), a floating diffusion region B (140b), photogate contacts A (221a, 222a), photogate contacts B (221b, 222b), a transfer gate contact A (230a), a transfer gate contact B (230b), a floating diffusion contact A (240a), a floating diffusion contact B (240b), a readout circuit A (600a), and a readout circuit B (600b).

The photoelectric conversion region A (110a) and the photoelectric conversion region B (110b) may be formed in the substrate 100, and may generate photocharges corresponding to incident light.

The photoelectric conversion region A (110a) and the photoelectric conversion region B (110b) may be disposed to face each other in the substrate 100.

The photogate A (120a) may be formed to overlap the photoelectric conversion region A (110a).

The photoelectric conversion regions 110a and 110b included in the unit pixel 10' may be disposed to face each other.

The photocharges generated in the photoelectric conversion region A (110a) may be transmitted to the floating diffusion region A (140a) by the photogate A (120a) and the transfer gate A (130a). The photocharges accumulated in the floating diffusion region A (140a) may be connected to the readout circuit A (600a) through the floating diffusion contact A (240a).

In addition, the photocharges generated in the photoelectric conversion region B (110b) may be transmitted to the floating diffusion region B (140b) by the photogate B (120b) and the transfer gate B (130b). The photocharges accumulated in the floating diffusion region B (140b) may be connected to the readout circuit B (600b) through the floating diffusion contact B (240b).

The readout circuit A (600a) may output a pixel signal A corresponding to photocharges accumulated in the floating diffusion region A (140a). In addition, the readout circuit B (600b) may output a pixel signal B corresponding to the photocharges accumulated in the floating diffusion region B (140b).

Each of the readout circuits 600a and 600b may include a reset transistor, a drive transistor, and a selection transistor.

The photogate A (120a) may be formed on the substrate 100 to vertically overlap the photoelectric conversion region A (110a). The photogate B (120b) may be formed on the substrate 100 to vertically overlap the photoelectric conversion region B (110b).

In the unit pixel 10' shown in FIG. 11, an activation voltage may be periodically applied to the photogate A (120a) and the photogate B (120b). In addition, an activation voltage may be periodically applied to the transfer gate A (130a) and the transfer gate B (130b).

Accordingly, pixel signals may be periodically output from the readout circuit A (600a) and the readout circuit B (600b). According to an embodiment of the disclosed technology, a time delay of incident light is measured by comparing the pixel signal A output from the readout circuit A (600a) and the pixel signal B output from the readout circuit B (600b), and a distance to the target object to be sensed can be calculated based on the measured time delay.

As is apparent from the above description, the image sensing device based on some implementations of the disclosed technology can improve transmission efficiency of photocharges generated by incident light.

The image sensing device based on some implementations of the disclosed technology can adjust transmission efficiency of photocharges according to the shape of a photogate included in a unit pixel.

The embodiments of the disclosed technology may provide a variety of effects capable of being directly or indirectly recognized through the above-mentioned patent document.

Those skilled in the art will appreciate that the disclosed technology may be carried out in other specific ways than those set forth herein. In addition, claims that are not explicitly presented in the appended claims may be presented in combination as an embodiment or included as a new claim by a subsequent amendment after the application is filed.

Although a number of illustrative embodiments have been described, it should be understood that modifications and/or enhancements to the disclosed embodiments and other embodiments can be devised based on what is described and/or illustrated in this patent document.

What is claimed is:

1. An image sensing device comprising: a substrate having two opposite surfaces;
   a photoelectric conversion region located in the substrate and configured to generate photocharges corresponding to incident light;
   a photogate region configured to overlap the photoelectric conversion region, and configured to allow the photocharges generated in the photoelectric conversion region to be collected in the photoelectric conversion region; and
   a transfer gate disposed adjacent to the photogate region in a first direction, and configured to transmit the photocharges collected in the photoelectric conversion region to a floating diffusion region,
   wherein the photogate region includes:
      a first photogate having a length that extends in a second direction and longer than a length of the photoelectric conversion region extending in the second direction; and
      a second photogate having a length that extends in the second direction and shorter than a length of the photoelectric conversion region extending in the second direction,
      wherein the first photogate includes
         a recess region contacting a side surface of the photoelectric conversion region, and extending vertically from one surface of the substrate with which the photoelectric conversion region is located in contact or near.

2. The image sensing device according to claim 1, wherein:
   the first photogate is disposed between the second photogate and the transfer gate, and the first photogate and the second photogate are in contact with each other.

3. The image sensing device according to claim 1, further comprising:
   a trench region formed to surround the photoelectric conversion region,
   wherein the recess region is disposed in the trench region.

4. The image sensing device according to claim 3, wherein:
   the trench region has an etched portion and the recess region is disposed in the etched portion of the trench region.

5. The image sensing device according to claim 1, wherein:
   the transfer gate is configured to receive a transmission control signal, and allow the photocharges to move from the photoelectric conversion region to the floating diffusion region based on the transmission control signal.

6. The image sensing device according to claim 1, wherein:
   the transfer gate overlaps the photoelectric conversion region and the floating diffusion region.

7. The image sensing device according to claim 1, wherein:
   the first photogate is connected to a first photogate contact; and
   the second photogate is connected to a second photogate contact.

8. The image sensing device according to claim 7, wherein:
   the first photogate contact is located closer to the photoelectric conversion region than the second photogate contact.

9. The image sensing device according to claim 7, wherein:
   the first photogate contact is connected to a first signal line; and
   the second photogate contact is connected to a second signal line,
   wherein a first photogate control signal applied to the first signal line and the second photogate control signal applied to the second signal line are activated at different time points.

10. The image sensing device according to claim 9, wherein:
    when the first photogate control signal has an activation level, a first collection region is disposed in the photoelectric conversion region; and
    when the second photogate control signal has an activation level, a second collection region is disposed in the photoelectric conversion region,
    wherein a length of the first collection region extending in the second direction is longer than a length of the second collection region extending in the second direction.

11. The image sensing device according to claim 10, wherein:
    a length of the second collection region extending in the first direction is longer than a length of the first collection region extending in the first direction.

12. The image sensing device according to claim 7, wherein:
    the first photogate contact and the second photogate contact are connected to one signal line.

13. The image sensing device according to claim 1, wherein:
    the floating diffusion region is connected to a readout circuit,
    wherein the readout circuit includes at least one of a drive transistor, a reset transistor, and a selection transistor.

14. The image sensing device according to claim 1, wherein:
    a length of the floating diffusion region extending in the second direction is shorter than a length of the transfer gate extending in the second direction.

15. An image sensing device comprising:
    a substrate;
    a photoelectric conversion region located in the substrate and having a thickness from a surface of the substrate and configured to generate photocharges in response to light incident on the substrate;

a first photogate region disposed over the photoelectric conversion region and configured to receive a first control signal to collect the photocharges in a first portion of the photoelectric conversion region;

a second photogate region disposed over the photoelectric conversion region and configured to receive a second control signal to collect the photocharges in a second portion of the photoelectric conversion region; and a trench region disposed on sides of the photoelectric conversion region and having a thickness greater than the thickness of the photoelectric conversion region, and wherein a portion of the first photogate region is disposed in the trench region.

16. The image sensing device according to claim 15, wherein the first photogate region has a length extending in a direction that is longer than a length of the photoelectric conversion region extending in the direction.

17. The image sensing device according to claim 15, wherein the second photogate region has a length extending in a direction that is shorter than a length of the photoelectric conversion region extending in the direction.

18. The image sensing device according to claim 15, further comprising:

a floating diffusion region disposed to contact the surface of the substrate; and a transfer gate disposed over the substrate to transmit the photocharges collected in the photoelectric conversion region to the floating diffusion region.

19. The image sensing device according to claim 15, further comprising:

a first photogate contact disposed on the first photogate region and configured to supply the first control signal to the first photogate region; and a second photogate contact disposed on the second photogate region and configured to supply the second control signal to the second photogate region.

20. The image sensing device according to claim 19, wherein the first photogate contact is located closer to the photoelectric conversion region than the second photogate contact.

* * * * *